(12) United States Patent
Crow et al.

(10) Patent No.: US 6,177,289 B1
(45) Date of Patent: Jan. 23, 2001

(54) LATERAL TRENCH OPTICAL DETECTORS

(75) Inventors: John Crow, Mt. Kisco; Steve Koester, Ossining; Daniel M. Kuchta, Patterson; Dennis L. Rogers, Croton on Hudson; Devendra Sadana, Pleasantville; Sandip Tiwari, Ossining, all of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/205,433

(22) Filed: Dec. 4, 1998

(51) Int. Cl.[7] .............. H01L 21/66; H01L 21/8242; H01L 21/20
(52) U.S. Cl. .............. 438/16; 438/243; 438/244; 438/245; 438/386; 438/387; 438/388
(58) Field of Search .............. 438/16, 243, 244, 438/245, 246, 247, 248, 249, 7, 386, 387, 388, 389, 390, 391, 392

(56) References Cited

U.S. PATENT DOCUMENTS 5,627,092 * 5/1997 Alsmeier et al. .............. 438/152

OTHER PUBLICATIONS

Rong–Heng Yuang et al., "Overall Performance Improvement in GaAs MSM Photodetectors by Using Recessed–Cathode Structure", IEEE Photonics Technology Letters, vol. 9, No. 2, Feb. 1997.

Jacob Y.L. Ho and K.S. Wong, "Bandwidth Enhancement in Silicon Metal–Semiconductor–Metal Photodetector by Trench Formation", IEEE Photonics Technology Letters, vol. 8, No. 8, Aug. 1996.

* cited by examiner

Primary Examiner—John F. Niebling
Assistant Examiner—Olivia T Luk
(74) Attorney, Agent, or Firm—F. Chau & Associates, LLP

(57) ABSTRACT

A monolithic semiconductor optical detector is formed on a substrate having a plurality of substantially parallel trenches etched therein. The trenches are further formed as a plurality of alternating N-type and P-type trench regions separated by pillar regions of the substrate which operate as an I region between the N and P trench regions. First and second contacts are formed on the surface of the substrate and interconnect the N-type trench regions and the P-type trench regions, respectively. Preferably, the trenches are etched with a depth comparable to an optical extinction length of optical radiation to which the detector is responsive.

10 Claims, 5 Drawing Sheets

LATERAL TRENCH OPTICAL DETECTORS

BACKGROUND OF THE INVENTION

1. Field of the Invention

The present invention generally relates to optical detectors, and more particularly, to high bandwidth monolithic optical detectors formed on a semiconductor optoelectronic integrated circuit.

2. Description of the Related Art

The increasing use of fiber optic computer communications has created a need for inexpensive high speed optical receivers. In particular, receivers using opto-electronic integrated circuit (OEIC) techniques in which the photo diodes are fabricated on the same chip as the electronic circuitry are desirable because of the resulting reduction in packaging and testing costs. At wavelengths less than about 870 nanometers (nm) metal-semiconductor-metal photo detectors can be formed on a substrate along with GaAs MESFET circuitry.

It is also desirable to form such detectors on a silicon substrate in order to take advantage of the lower manufacturing costs associated with silicon fabrication. However, the long optical absorption length for silicon at wavelengths of about 850 nm is prohibitive. This absorption length, which is about 12 $\mu$m, requires relatively thick layers of high resistivity silicon to absorb an appreciable amount of incident light. Unfortunately, such thick layers are not available in the device portion of standard silicon integrated circuit processes. Further, the long absorption length also leads to long transit times for electrons and holes to move through these layers, thereby limiting the frequency response of prior art silicon detectors.

Accordingly, there remains a need for an optical detector design which is compatible with current silicon manufacturing technology and offers sufficient bandwidth to be useful in high speed optical communications applications.

SUMMARY OF THE INVENTION

In accordance with one form of the present invention, a monolithic semiconductor optical detector is formed on a semiconductor substrate having a plurality of trenches etched therein. The trenches are formed as a plurality of alternating N-type and P-type trench regions separated by a pillar region of the substrate. A first contact connects the N-type trench regions and a second contact connects the P-type trench regions.

To establish the N-type and P-type trench regions, a layer of amorphous silicon is deposited in the trenches of the substrate. The N-type trench regions are then formed by infusing N-type semiconductor impurities into the amorphous silicon and the P-type trench regions are formed by infusing P-type semiconductor impurities into the amorphous silicon.

The trenches preferably have a depth which is comparable to an optical extinction length of optical radiation to which the detector is responsive to. Preferably, the monolithic semiconductor optical detector is responsive to radiation of about 850 nanometers (nm) and the depth of the trenches is in the range of about 10–15 micrometers ($\mu$m).

In accordance with a method of the present invention, an optical detector is formed on a semiconductor substrate by the steps of: forming a plurality of trenches on the substrate; forming alternating N-type and P-type regions in alternate trenches, respectively; forming a contact layer over said regions; forming a first contact connecting the N-type regions; and forming a second contact connecting the P-type regions.

These and other objects, features and advantages of the present invention will become apparent from the following detailed description of illustrative embodiments thereof, which is to be read in connection with the accompanying drawings.

BRIEF DESCRIPTION OF THE DRAWINGS

The invention will be described in detail in the following description of preferred embodiments with reference to the following figures, wherein.

DETAILED DESCRIPTION OF PREFERRED EMBODIMENTS

An optical detector is formed on a semiconductor substrate by forming a plurality of substantially parallel trenches in the substrate to form a plurality of pillars separated by alternating trench regions of N-type and P-type doped material. The N-type regions are connected together to form an N-contact and the P-type regions are connected to form a P-contact. The pillars function as I regions, thereby forming a plurality of parallel PIN photo diodes. The basic principle behind this detector topology is to sweep away the photo generated carriers from the absorption region of the detector in a direction perpendicular to the incident light.

Figure 3:
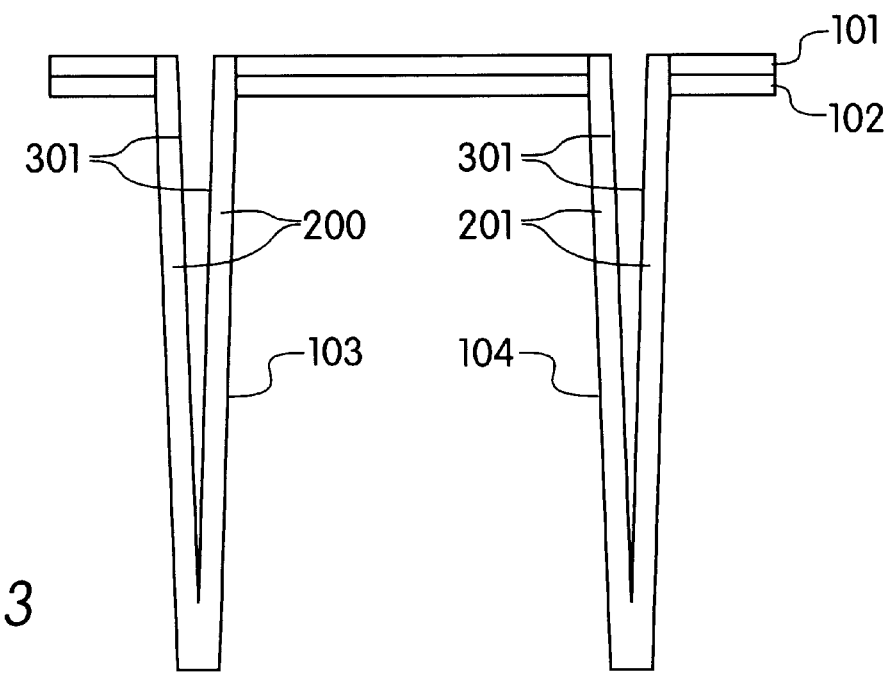
FIG. 3 is a cross sectional view of a lateral trench detector being formed in a semiconductor substrate in accordance with the present invention, further showing a deposit of a titanium layer on the walls of the trenches.
Figure 4A:
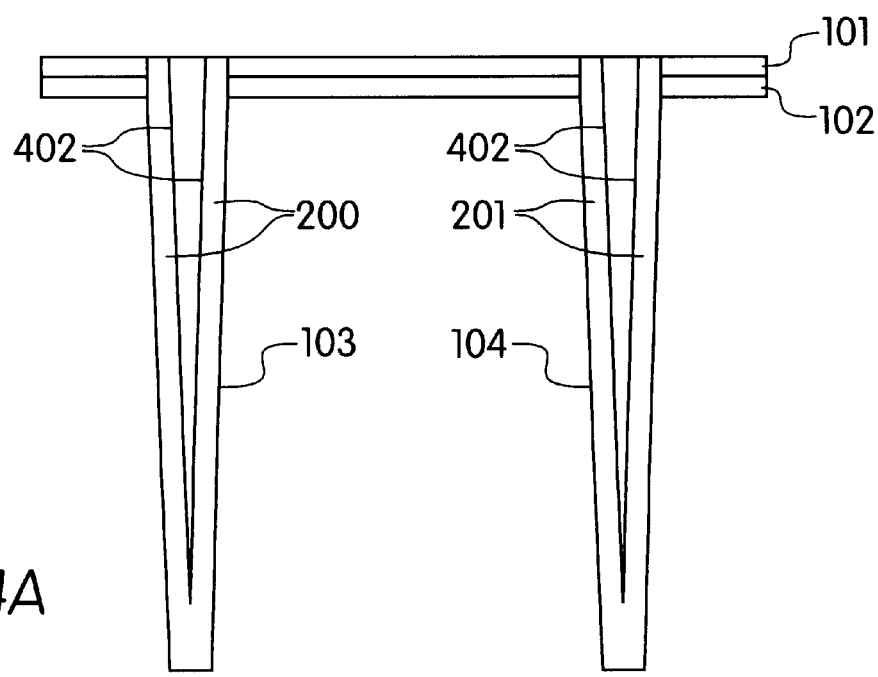
FIG. 4A is a cross sectional view of a lateral trench detector formed in a semiconductor substrate in accordance with the present invention.
Figure 4B:
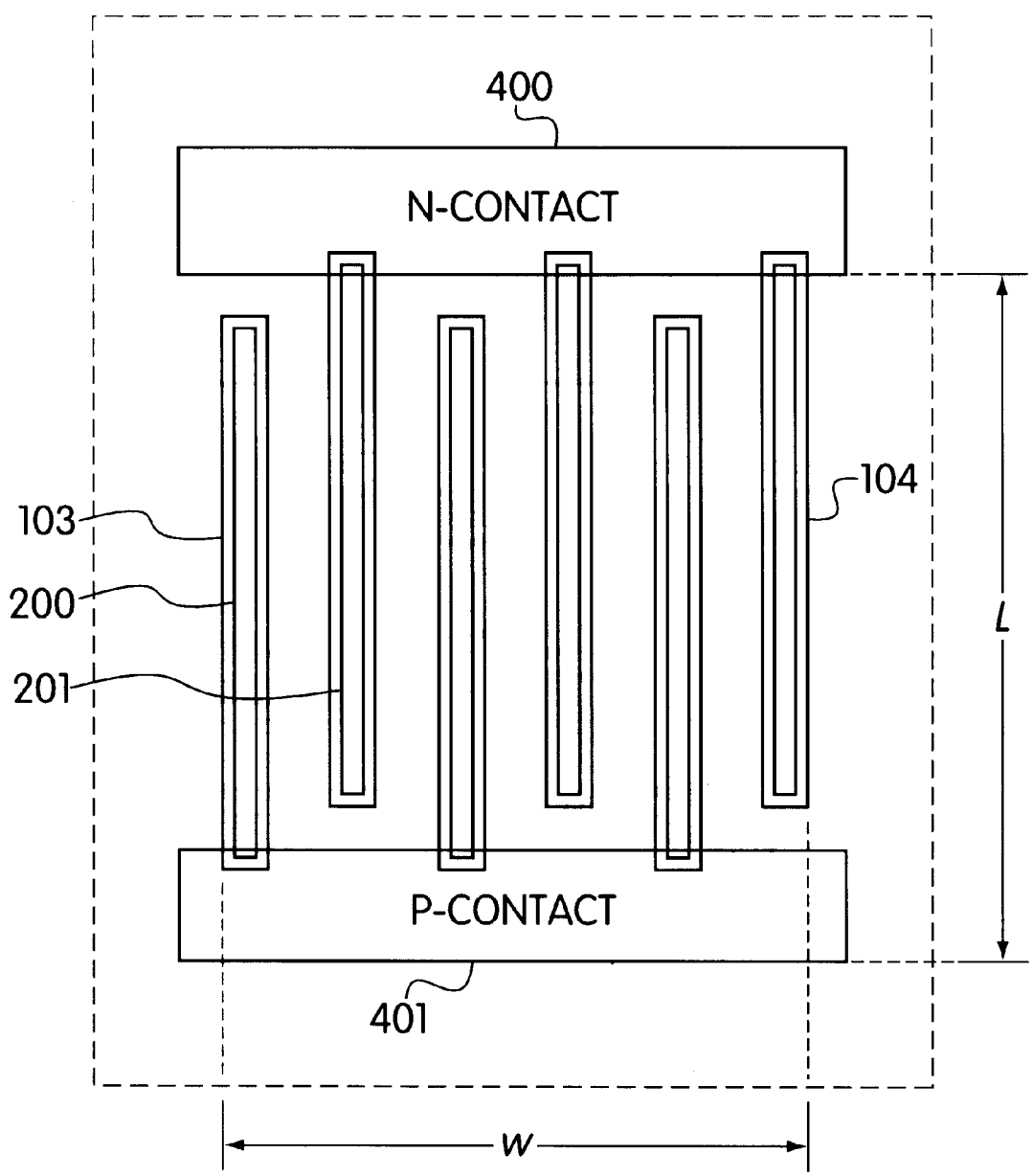
FIG. 4B is a top view of a lateral trench detector formed in a semiconductor substrate in accordance with the present invention.
Figure 5:
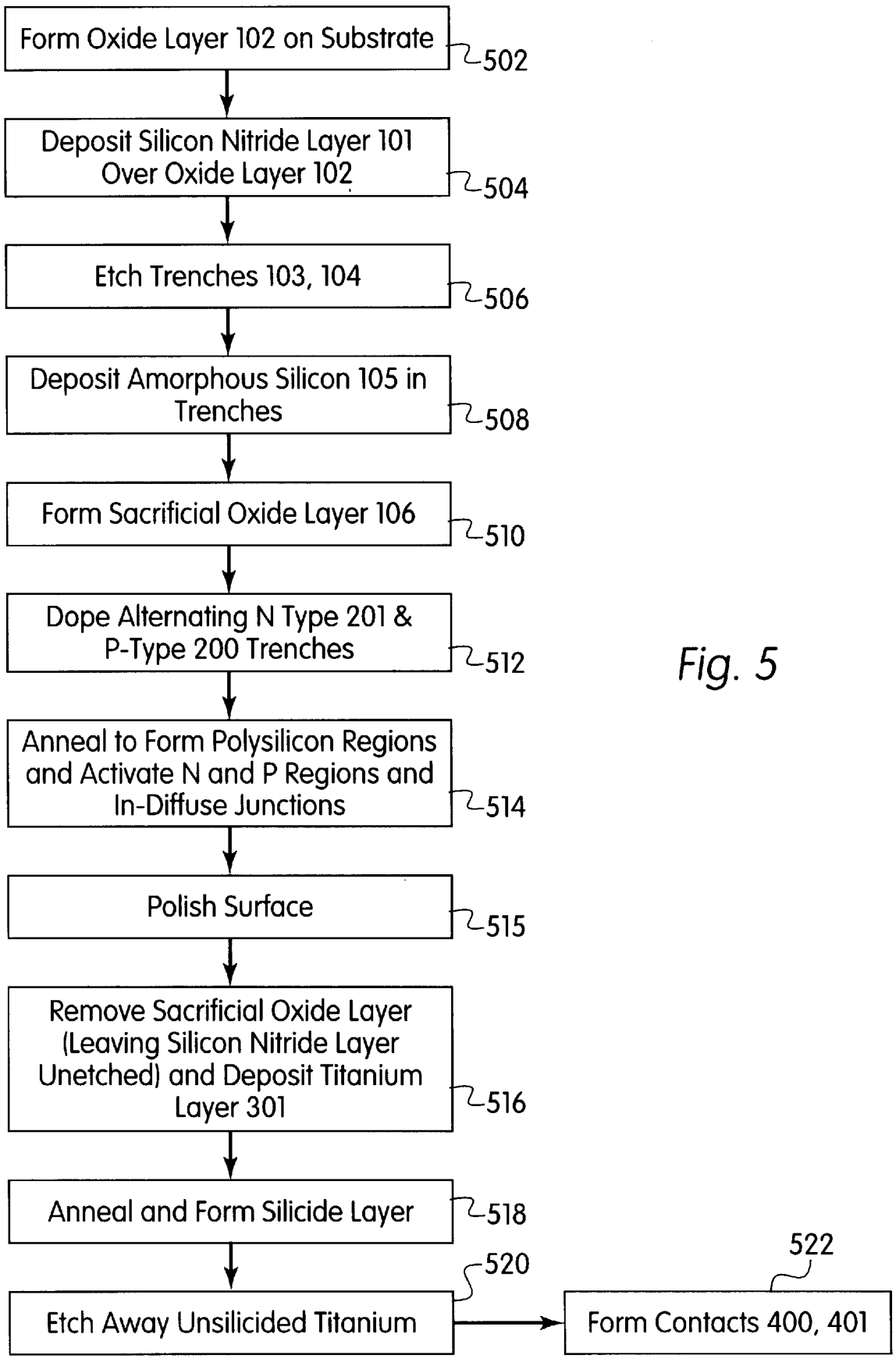
FIG. 5 is a flow chart illustrating the steps employed in forming a lateral trench detector as illustrated in FIGS. 1A through 4B.

FIG. 1A through FIG. 4B illustrate a lateral trench detector at progressive stages of formation in accordance with the present invention. FIG. 5 is a flow chart further illustrating the manufacturing steps used to form a detector in a manner depicted in FIGS. 1A through 4B.

Figure 1A:
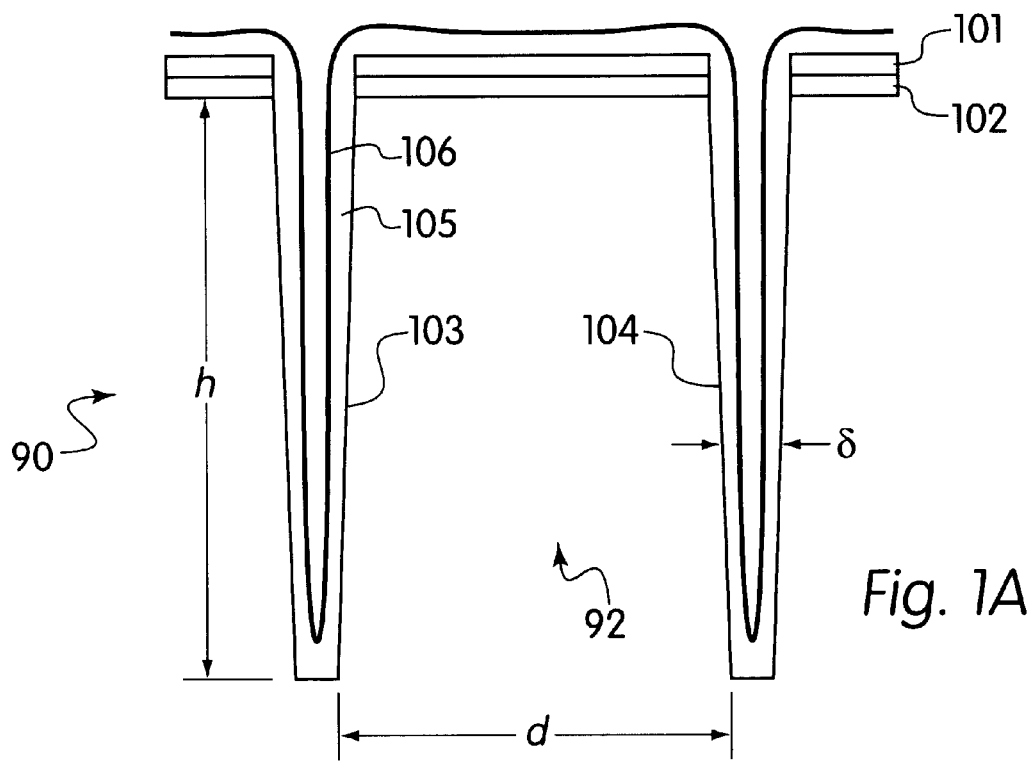
FIG. 1A is a cross sectional view of a lateral trench detector being formed in a silicon substrate in accordance with the present invention.
Figure 1B:
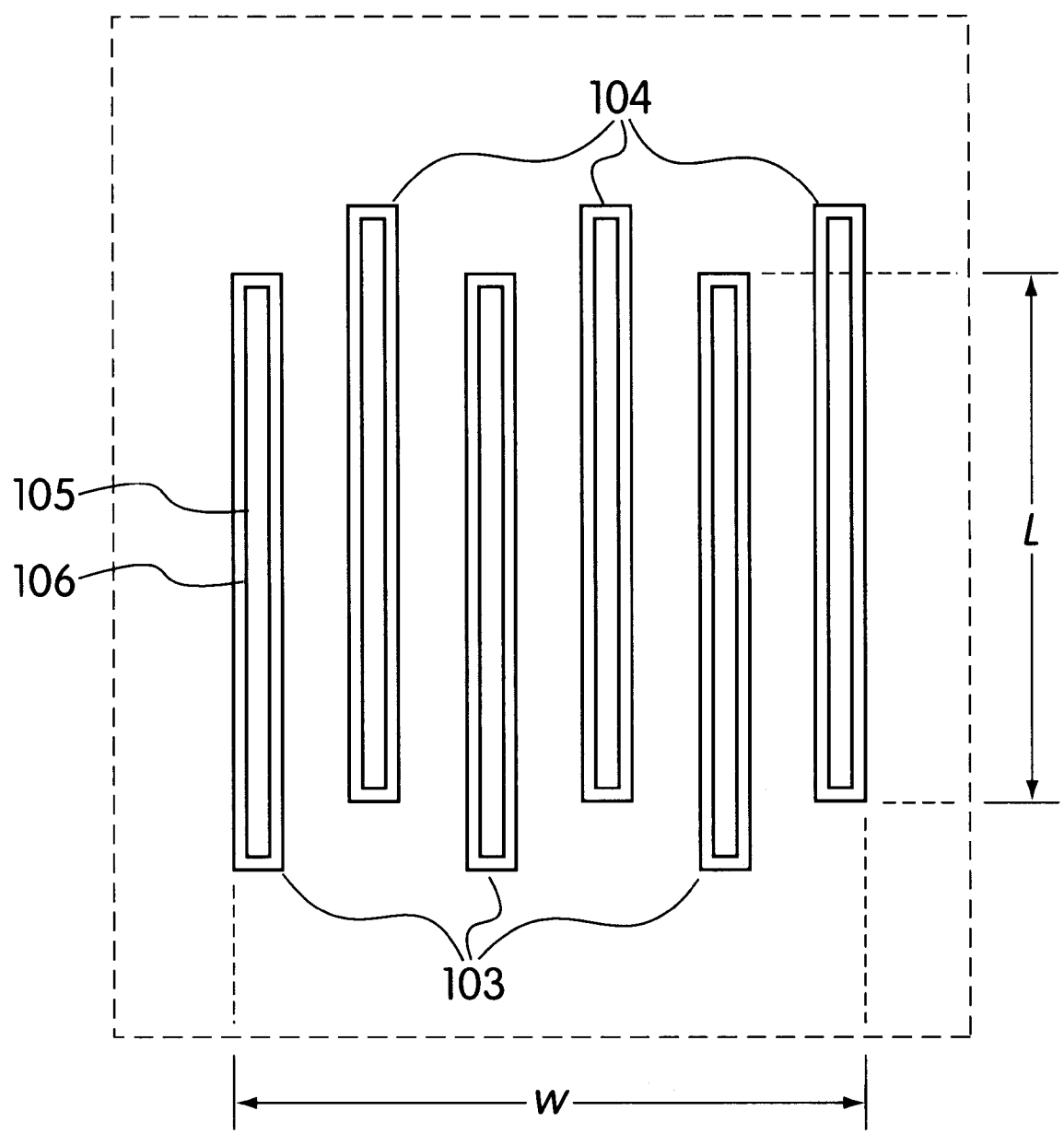
FIG. 1B is a top view of a lateral trench detector, at the same stage of formation as illustrated in FIG. 1A, in accordance with the present invention.

Referring to FIGS. 1A and 1B, a lateral trench detector is formed on a lightly doped semiconductor substrate 90, such as silicon germanium, germanium, silicon carbide and preferably taking the form of silicon. A thermal oxide layer 102 is formed on the surface of the substrate 90 and then a silicon nitride layer 101 is deposited over the oxide layer 102. These steps are illustrated in FIG. 5 as steps 502 and 504 respectively. The oxide layer 102 and silicon nitride layer 101 protect the surface of the substrate 90 from further processing.

Next, a number of trenches are formed (step 506) in the substrate 90, preferably using a process such as reactive ion etching (RIE) in a manner commonly used to form trench capacitors for integrated circuit memory devices. As shown in FIG. 1B, the trenches are formed as two sets of substantially parallel trenches 103, 104. Trenches 103, 104 are of substantially equal length and depth. However, trenches 103 are slightly offset from trenches 104, as illustrated in FIG. 1B. Connected pillar regions of silicon 92 remain between trenches 103 and 104. Trenches 103, 104 are preferably made as narrow as manufacturing processes will allow such that the active region of the detector is dominated by the pillar regions 92. Currently, trench widths on the order of 0.2 micron are attainable. The depth of the trenches 103,104 is preferably comparable to the optical extinction length of optical radiation in the silicon substrate 90 to which the detector will be responsive. For radiation of about 850 nm, the depth is on the order of 10–15 $\mu$m.

The performance of the detector is largely dictated by the responsivity and capacitance of the detector. The capacitance of the detector is expressed by Equation 1 as follows:

$$C = N \frac{\epsilon h l}{d} \quad \text{Eq. 1}$$

where w is the width of the detector, l is the length of the detector, d is the width of the pillar regions 92, $\mathring{A}$ is the dielectric constant of the substrate 90, h is the pillar height (or trench depth), $\delta$ is the trench width, and N=w/(d+$\delta$) which is equal to the number of pillars. The detector capacitance can also be expressed as:

$$C = \frac{\epsilon h w l}{d v_p \tau} \quad \text{Eq. 2}$$
$$= N \frac{\epsilon h l}{v_p \tau}$$

where $v_p$ is the photo-carrier saturation velocity, $\tau$ is the response time of the detector and N is the number of pillar regions 92 in the detector. In designing the detector, the capacitance and the related physical parameters of the detector are selected in order to balance the competing requirements of speed and noise performance. Assuming that all of the photocarriers are collected and neglecting surface reflections, the responsivity of the detector can be expressed as:

$$R = \frac{q\lambda}{hc}\left(\frac{d}{d+\delta}\right) \quad \text{Eq. 3}$$

where $\lambda$ is the wavelength and hc/$\lambda$=1.24 $\mu$m.

Figure 2:
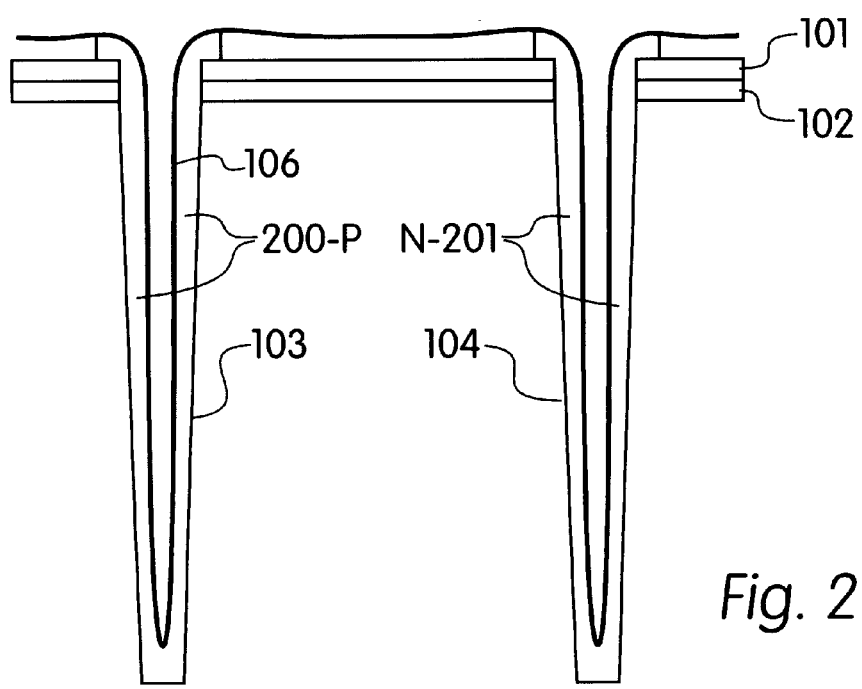
FIG. 2 is a cross sectional view of a lateral trench detector being formed in a semiconductor substrate in accordance with the present invention, further showing the doping of alternate trenches with N-Type and P-Type semiconductor impurities, respectively.

After forming trenches 103, 104, a layer of intrinsic amorphous silicon 105 is deposited over the surface of the substrate and walls of trenches 103, 104 (step 508). Over this silicon layer 105, an oxide layer 106 is formed (step 510) to protect the surface of the silicon layer 105. Photolithography is then used to selectively implant P-type and N-type impurities into the silicon layer 105 of trenches 103 and 104 respectively (step 512). After the N-type and P-type regions have been implanted, the substrate is subjected to a high temperature annealing process to convert the amorphous silicon into polysilicon and provide slight diffusion into the single crystal silicon, while activating the N-type and P-type implants 200, 201 (step 514). The annealing process is preferably performed at temperatures of about 950–1050° for about 5–30 seconds. This process forms alternating P-type polysilicon regions 200 and N-type polysilicon regions 201 separated by the lightly doped silicon pillar regions 92, which function as I-type regions as shown in FIG. 2. The result is an array of PIN type photo diodes.

Following annealing, the surface of the substrate 90 is chem-mechanically polished (CMP) to remove the polysilicon and oxide layer from the surface of the substrate (step 515). Next, the oxide layer 106 is etched from the trenches 103, 104 and a silicide contact layer is formed on the surface of the polysilicon regions 200, 201 (steps 516–520), as shown in FIG. 3. One method of forming the silicide contact layer is to deposit a layer of titanium 301 (step 516) following removal of the sacrificial oxide layer from the surface of the substrate 90. Note, that the surface of the substrate is protected by the silicon nitride layer 101 during this step. The substrate is then annealed to react the titanium with the underlying silicon regions 200, 201, thereby creating silicide layers 402 (step 518). Any remaining titanium is then etched away from the silicide layers and substrate surface (step 520) as is illustrated in FIG. 4.

To complete the detector, metallic contacts 400, 401 are formed on the surface of the detector (step 522). Referring to FIG. 4B, the contacts 400, 401 are formed in a substantially perpendicular alignment to trenches 103, 104. The N-type polysilicon trench regions 200 are connected together by N-contact 400 and the P-type polysilicon trench regions are connected together by P-type contact 401. The contacts can be formed using conventional methods such as lift-off or subtractive fabrication processes.

Detectors formed in accordance with the present invention offer both high bandwidth and lower cost. The selection of the physical parameters of the detector allow a designer to optimize the performance of the detector for bandwidth and noise performance. The detectors of the present invention are formed in a semiconductor substrate, such as silicon, using conventional manufacturing techniques commonly used in memory integrated circuit fabrication. As such, the detectors of the present invention can easily be integrated with other semiconductor integrated circuit components such as amplifiers, logic functions and the like to form integrated optical components such as fiber optic receivers.

Having described preferred embodiments of the present invention, it is noted that modifications and variations can be made by persons skilled in the art in light of the above teachings. It is therefore to be understood that changes may be made in the particular embodiments of the invention disclosed which are within the scope and spirit of the invention as outlined by the appended claims.

What is claimed is:

1. A method for fabricating an optical detector on a semiconductor substrate, comprising the steps:

forming a plurality of trenches in the substrate;

forming alternately N-type and P-type regions from said trenches;

forming a contact layer on said N-type and P-type regions;

forming a first contact connecting said N-type regions; and forming a second contact connecting said P-type regions to form said optical detector.

2. The method for fabricating an optical detector on a semiconductor substrate as defined by claim 1 wherein said step of forming a plurality of trenches is performed using reactive ion etching.

3. The method for fabricating an optical detector on a semiconductor substrate as defined by claim 1, wherein said step of forming alternating N-type and P-type regions includes the further steps of:

introducing a layer of amorphous silicon in said trenches; and introducing N-type and P-type impurities into the layer of amorphous silicon in alternating trenches, respectively.

4. The method for fabricating an optical detector on a semiconductor substrate as defined by claim 3, wherein said introducing step is performed using a photolithography process.

5. The method for fabricating an optical detector on a semiconductor substrate as defined by claim 1, wherein said step of forming a contact layer over said N-type and P-type regions includes the step of forming a silicide layer over said region.

6. The method for fabricating an optical detector on a semiconductor substrate as defined by claim 5, wherein said step of forming a silicide layer includes the steps:

depositing a metallic layer over said regions;

annealing said substrate to infuse said metallic layer into the surface of said regions; and removing any non-infused metallic layer.

7. The method for fabricating an optical detector on a semiconductor substrate as defined by claim 1, wherein the substrate is single crystal silicon.

8. The method for fabricating an optical detector on a semiconductor substrate as defined by claim 1, wherein the substrate is silicon germanium.

9. The method for fabricating an optical detector on a semiconductor substrate as defined by claim 1, wherein the substrate is germanium.

10. The method for fabricating an optical detector on a semiconductor substrate as defined by claim 1, wherein the substrate is silicon carbide.

* * * * *